(12) United States Patent
Speckels et al.

(10) Patent No.: US 8,439,249 B2
(45) Date of Patent: May 14, 2013

(54) DEVICE AND METHOD FOR MAKING A SEMICONDUCTOR DEVICE INCLUDING BONDING TWO BONDING PARTNERS

(75) Inventors: Roland Speckels, Kamen (DE); Thomas Licht, Warstein (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 271 days.

(21) Appl. No.: 12/567,434

(22) Filed: Sep. 25, 2009

(65) Prior Publication Data
US 2010/0078463 A1    Apr. 1, 2010

(30) Foreign Application Priority Data
Sep. 25, 2008  (DE) .......................... 10 2008 048 869

(51) Int. Cl.
*B23K 20/08*   (2006.01)
*H01L 21/00*   (2006.01)
(52) U.S. Cl.
USPC ................ 228/106; 228/179.1; 228/180.1; 438/107; 438/455
(58) Field of Classification Search .................. 228/212, 228/179.1, 180.1, 106; 438/455, 107
See application file for complete search history.

(56) References Cited

U.S. PATENT DOCUMENTS

| | | | |
|---|---|---|---|
| 4,810,672 | A | 3/1989 | Schwarzbauer |
| 4,903,885 | A | 2/1990 | Schwarzbauer |
| 5,379,942 | A | 1/1995 | Kuhnert et al. |
| 6,041,996 | A | 3/2000 | Arikado |
| 6,621,157 | B1 | 9/2003 | Wirz et al. |
| 7,525,187 | B2 | 4/2009 | Speckels et al. |
| 2001/0002283 | A1* | 5/2001 | Sun et al. ..................... 427/469 |
| 2001/0037862 | A1 | 11/2001 | Moriuchi |
| 2008/0188058 | A1 | 8/2008 | Nishimura et al. |

FOREIGN PATENT DOCUMENTS
EP    1321967    6/2003

* cited by examiner

*Primary Examiner* — Nicholas P D'Aniello
(74) *Attorney, Agent, or Firm* — Dicke, Billig & Czaja, PLLC

(57) ABSTRACT

A device and a method for making a semiconductor device including bonding a first bonding partner to a second bonding partner. The device comprises a lower tool and an upper tool, the upper tool including a plunger having a bottom side facing the lower tool at which bottom side a vacuum is creatable, so that the first bonding partner can be picked up by vacuum from the upper tool and positioned on the second bonding partner.

13 Claims, 7 Drawing Sheets

DEVICE AND METHOD FOR MAKING A SEMICONDUCTOR DEVICE INCLUDING BONDING TWO BONDING PARTNERS

CROSS-REFERENCE TO RELATED APPLICATIONS

This Utility Patent Application claims priority to German Patent Application No. DE 10 2008 048 869.0-33, filed on Sep. 25, 2008, and incorporated herein by reference.

BACKGROUND

The invention relates to a device and method for bonding two bonding partners. Typical bonding bonding partners include components of a power semiconductor module. A typical example includes a semiconductor chip needing to be firmly and durably bonded to a wafer or substrate. For bonding a semiconductor chip to a substrate, for example, by using a low-temperature bonding technique, a plunger is employed which presses the semiconductor chip against the substrate. When positioning the semiconductor chip on the substrate there is, however, a risk of the semiconductor chip slipping out of place because of its low weight.

One known technique to correctly position a chip on a substrate is to upfront actual bonding by a prelocating step in which the bond between the semiconductor chip and the substrate features a strength which is less than the necessary final strength, but sufficient to position the composite of the substrate and semiconductor chip in a bonder for producing a bond of high strength. For example, a sintering tool may be used without the position of the semiconductor chip relative to that of the substrate being altered. At that time, a high-strength, durable bond is produced. However, such a prelocating step adds to the complications of the process, and also adds to the time needed to make the bond.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The invention will now be explained by way of example embodiments with reference to the FIGs.

FIG. 1B is bonded by using a further bonding layer before producing the bond between the substrate and the base plate.

DETAILED DESCRIPTION

Figure 1A:
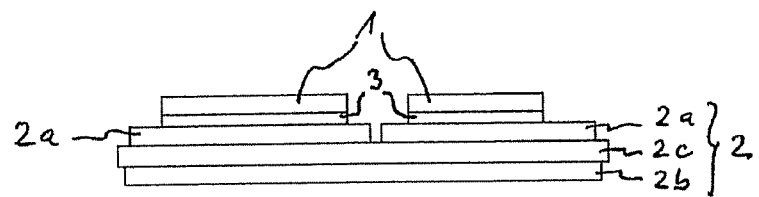
FIG. 1A is a side view of a substrate to which two semiconductor chips are each bonded using a bonding layer.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the FIGs. like reference numerals identify like elements having the same function. The FIGs. are generally not true to scale, to make for a better representation. Terms as used in the description such as "upper", "lower", "top side", "bottom side" are intended to make for a better appreciation of the FIGs., they not being intended to define any absolute direction in space, e.g., as regards the earth's surface, the floor or the like.

One embodiment provides a device for bonding a first bonding partner to a second bonding partner which now makes it possible to bond the partners together firmly, durably and correctly placed each relative to the other without the need of a means for prelocating the bonding partners involved.

Another embodiment provides a method for producing such a bond.

A device for bonding a first bonding partner to a second bonding partner comprises a lower tool and an upper tool. The upper tool comprises a plunger having a bottom side facing the lower tool at which—relative to the pressure of the ambient atmosphere of the device—a vacuum is creatable.

In one embodiment of a method employing the device, a first bonding partner and a second bonding partner are provided. The second bonding partner is positioned in the lower tool. The plunger and the first bonding partner are positioned each relative to the other so that the first bonding partner is located below the bottom side of the plunger. By creating—relative to the pressure of the ambient atmosphere of the device—a vacuum at the bottom side of the plunger facing the lower tool, the first bonding partner is picked up by the vacuum at the bottom side of the plunger and the picked-up first bonding partner positioned above a predefined bonding site on the second bonding partner. The first bonding partner is pressed against the second bonding partner by using the plunger.

The FIGS. 1A to 1D illustrate one or more embodiments of sub-modules of a power semiconductor module, each including one or more bonds as can be fabricated by using a device as explained and in accordance with a method as explained.

FIG. 1A illustrates one embodiment of a side view of a substrate 2 forming a conductor board. The substrate 2 includes an insulating substrate 2c with a top-side circuitry pattern 2a and an optional bottom-side circuitry pattern 2b. Sited on portions spaced away from each other of the circuitry pattern 2a are semiconductor chips 1 each connected using a bonding agent 3 to the corresponding circuitry pattern 2a and thus also to the substrate 2.

The substrate 2 may be, for example, a metallized ceramic substrate, e.g., a direct copper bonding (DCB), an active metal brazing (AMB) or a direct aluminum bonding (DAB) substrate. The top-side circuitry pattern 2a and the optional bottom-side circuitry pattern 2b may include, for example, a layer of copper coated at least on its side facing away from the insulating substrate 2c with one or more optional coatings. One such optional coating may be, for example, of nickel-gold (NiAu) or nickel-silver (NiAg) or silver (Ag). The thickness of the copper layer may be, for example, in the range 0.1 mm to 1 mm.

In one embodiment, the insulating substrate 2c is a ceramic, e.g., an aluminum oxide ceramic or aluminum nitride ceramic or a silicon nitride ceramic.

A conventional printed circuit board (PCB) may be employed as the substrate 2 in which the insulating substrate 2c is a FR4, or Pertinex or PTFE (polytetrafluorothylene) or epoxy-based substrate.

One suitable as a bonding agent 3 is a solder, e.g., a solder paste or metal powder paste and a solvent mixture for producing a low-temperature bond. Another suitable bonding agent 3 is an electrically conductive adhesive.

Figure 1B:
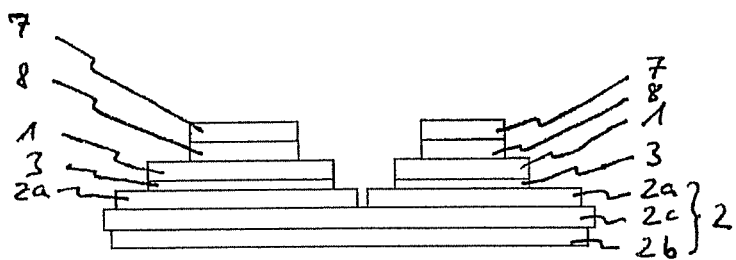
FIG. 1B is a side view of the assembly illustrated in FIG. 1A in which each semiconductor chip features at the side facing away from the substrate a metallization bonded to each semiconductor chip by using a bonding layer.

FIG. 1B illustrates the assembly of to FIG. 1A including a substrate 2 componented with semiconductor chips 1. The semiconductor chips 1 include a metallization 7 on the top sides facing away from the substrate 2, configured as a platelet and applied and bonded to the active surface of the semiconductor chip 1 by using a bonding layer 8. The thickness of the metallization 7 may be in the range 50 m to 1 mm. Irrespective of the thickness, metallization 7 may include copper or aluminum or an alloy of at least one of these materials or made of one of these materials. It is always the case, however, that optional metals or alloys may be employed for the metallization 7.

Figure 1C:
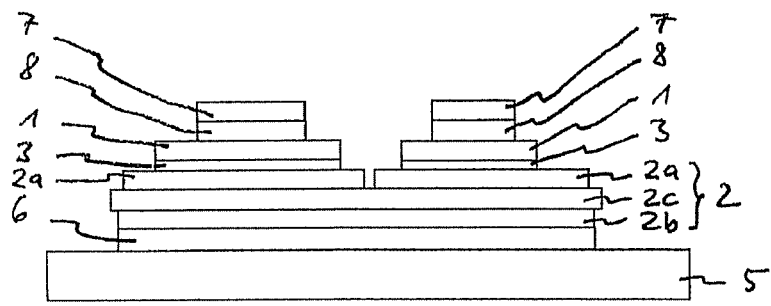
FIG. 1C is a side view of a base plate to which an assembly as illustrated in FIG. 1A or 1B is bonded by using a bonding layer.

FIG. 1C illustrates an assembly including a base plate 5 of a power semiconductor module, for example, mounting an assembly as illustrated in FIGS. 1A or 1B by using a further bonding layer 6. The base plate 5 may be made completely or at least substantially of copper or aluminum or of metal matrix composite (MMC) materials such as e.g., aluminum silicon carbide (AlSiC) or copper silicon carbide (CuSiC) or aluminum carbide (AlC) or of aluminum and graphite.

Figure 1D:
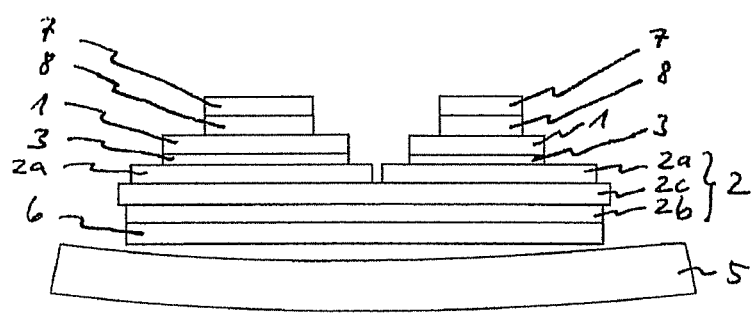
FIG. 1D is a side view of a curved base plate featuring a concave portion in the region of which an assembly as illustrated in FIG. 1A

FIG. 1D illustrates another embodiment of an assembly including a base plate 5 which may be configured the same as already described in FIG. 1C but additionally including a top-side concave curved portion topped by an assembly as illustrated in FIGS. 1A or 1B. In this arrangement the bottom-side metallization 2b of the substrate 2 is provided with a bonding layer 6 serving in a subsequent bonding process to bond the substrate 2 componented with the semiconductor chip 1 to the curved base plate 5.

Figure 2A:
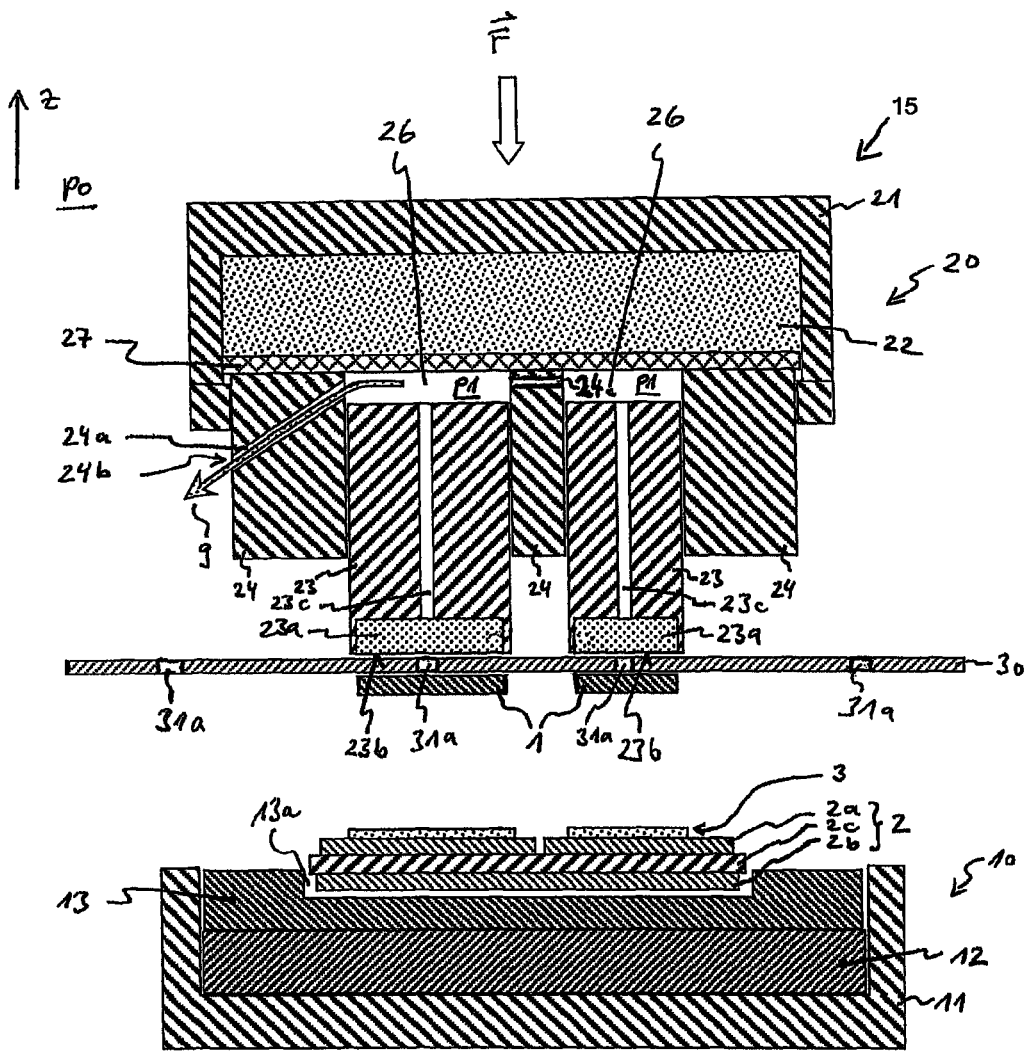
FIG. 2A is a cross-section through a device for bonding a semiconductor chip to a substrate, including an upper tool and a lower tool, the upper tool featuring a plunger at the bottom side of which a vacuum can be created for picking up a semiconductor chip.

FIG. 2A is a vertical section illustrating one embodiment of a device 15. In one embodiment device 15 is operable for bonding a semiconductor chip 1 to a substrate 2. Device 15 includes a lower tool 10 and an upper tool 20. The lower tool 10 includes a housing 11 enhousing a heatable mount 12. Arranged on the heatable mount 12 is a positioning aid 13 including a recess 13a for dead-true insertion of a substrate 2. This recess 13a in the positioning aid 13 is adapted to the substrate 2 for componenting so that the position of the substrate 2 inserted in the recess 13a is reproducibly defined as regards the lower tool 10.

Lower tool 10 can be used and is configurable for producing a variety of sub-modules. The positioning aid 13 may be optionally configured as a swap insert to adapt to the substrate 2 differing in geometry and/or layout at any time simply by inserting a dedicated positioning aid 13 into the lower tool 10.

The upper tool 20 includes a housing 21 into which, for example, two plungers 23 are inserted, guided by a plunger guide 24. To produce other sub-modules it may be sufficient to use just one plunger 23. In other embodiments, more than two plungers 23 may be used. In one embodiment, the plungers 23 are vertically movable in the plunger guide 24 in the z direction, i.e. in the direction to and from the lower tool 10. Provided above the plungers 23 is an elastic pressure pad 22 that exerts a uniform pressure on the plungers 23 when the upper tool 20 is pressed against the lower tool 10. To prevent the pressure pad 22 from being damaged by the plungers 23, an optional protective film 27 is disposed between the plungers 23 and the elastic pressure pad 22.

Each of the plungers 23 comprises at least one vacuum conduit 23c integrated in the corresponding plunger 23. These vacuum conduits 23c can receive—relative to an ambient atmospheric pressure p0 of the device—a vacuum p1, creating a vacuum at the bottom side 23b of the plungers 23. Using the vacuum, the semiconductor chips 1 can be picked up in the direction of the bottom side 23b of each plunger 23 and held there in position.

In one embodiment, vacuum conduit 23c may be configured, e.g., as a straight drilling extending from the top-side of the plunger 23 facing the pressure pad 22 to the bottom side 23b thereof As an alternative, a vacuum conduit 23c may also be configured branched so that two or more pneumatically interconnected branch conduits extend down to the bottom side 23b of the plunger 23 where achieving by using the multiple porting arrangement a more uniform distribution of the vacuum p1 in operation of the device 15. However, it is just as possible, to provide a parallel arrangement of several straight drillings in a plunger 23 each extending full-length from the top-side of the plunger 23 to the bottom side 23b thereof.

The run of the vacuum conduit 23c integrated within a plunger 23 is optionally selectable, as long as a vacuum is created at the bottom side 23b of the plunger. In one embodiment, the upper tool 20 includes a connector 24b for coupling to a pump to create a vacuum p1 in a pneumatically coupled system of conduits in the upper tool 20 for communication to the bottom side 23b of the plungers 23.

For this purpose there is provided in the device as illustrated in FIG. 2A a vacuum conduit 24a which passes through the plunger guide 24 and is pneumatically connected to the connector 24b. As long as the plungers 23 are not in their top position, i.e. spaced away from the pressure pad 22 and possibly from the protective film 27, domains 26 materialize between the top sides of the plungers 23, the elastic pressure pad 22 and the protective film 27 respectively as well as the plunger guide 24 which are pneumatically connected to the vacuum conduits 24a and 23c. It is this pneumatic connection together with the vacuum conduit 23c extending in the direction of the bottom side 23b that results in a vacuum p1 created at the connector 24b being applied to the bottom sides 23b of the plungers 23. To pneumatically couple the two domains 26, a connecting conduit 24c is provided configured in the plunger guide 24. The direction of the gas flow, when exhausting a gas from the vacuum conduits 23c, the domains 26 and the vacuum conduits 24a, is indicated in FIG. 2A by an arrow 9.

In the arrangement as illustrated in FIG. 2A each plunger 23 ends, facing away from the pressure pad 22, in a pressure transmission element 23a serving to communicate a contact pressure of, for example, at least 900 N/cm2 to each of the semiconductor chips 1 when making the bond. The pressure transmission element 23a as illustrated in FIG. 2A may be, for example, porous, gas-permeable members. In one embodiment, it is because of this gas permeability that a vacuum p1 existing in the vacuum conduit 23c of the plungers 23 can be communicated to the bottom side 23b of the pressure transmission element 23a which in such an arrangement also forms portions of the bottom side 23b of the plungers 23 resulting in a vacuum p1 existing at the bottom side 23b of the plunger 23.

Vacuum p1 enables semiconductor chips 1 to be picked up by the upper tool 20 and held at the bottom side 23b of the corresponding plungers 23 and positioned in relation to the lower tool 10 by travelling the upper tool 20 relative to the lower tool 10. Positioning the semiconductor chips in this way may be defined so that the semiconductor chips 1 positioned relative to a substrate 2 inserted before, simultaneously or after positioning in the recess of the positioning aid 13 can be precisely positioned as defined on the substrate 2 without the semiconductor chips 1 slipping out of place. In the arrangement as illustrated in FIG. 2A these predefined positions are indicated by the pads in the circuitry pattern 2a.

FIG. 2A illustrates one embodiment of how the pads of the circuitry pattern 2a are topped by a bonding agent 3 applied to the substrate 2 serving to bond the semiconductor chips 1 to corresponding pads of the circuitry pattern 2a in a later bonding step. As an alternative, or in addition thereto, a bonding agent may also be applied to the bottom surfaces of the semiconductor chips 1 facing away from the plunger 23 before the semiconductor chips 1 are positioned on the substrate 2, respectively on the bonding agent 3 applied thereto.

The bonding agent may be, for example, a solder paste, a metal powder provided with at least one soldering agent, or an electrically conductive adhesive. Placing the semiconductor chips 1 on the substrate 2 may be done simply by plunging the upper tool 20 with the vacuum-held semiconductor chip 1 contrary to the vertical direction z onto the lower tool 10 componented with the substrate 2.

Optionally, the upper tool 20 may also be travelled in one or more directions transversely to the vertical direction z, e.g., along a non-linear path in relation to the lower tool 10. In this embodiment, the semiconductor chips 1 can be precisely positioned by using a suitable feeder positioned sideways to the bonder 10, 20 and thus precisely picked up by the vacuum of the upper tool 20 and maintained precisely positioned as defined for placement on the substrate 2.

The feeder may be configured so that the semiconductor chips 1 can be prepositioned each relative to the other corresponding to their predefined relative positions on the substrate 2 finish componented with the semiconductor chips 1 and bonded thereto. Thus a plurality of semiconductor chips 1 prepositioned in this way can be simultaneously picked up by the vacuum of the upper tool 20 and placed on the substrate 2. Prepositioning may be done, e.g., by using a product carrier configured so that the semiconductor chips 1 inserted therein are already positioned as predefined each relative to the other.

The product carrier may include a recess for each of the semiconductor chips configured or adapted to the geometry of a semiconductor chip to be inserted therein so that it is located relative to another semiconductor chip correspondingly inserted in another recess.

As an alternative the feeder may also be a feeder film to which the semiconductor chips 1 are removably adhesively bonded in their predefined relative position on the sub-module to be fabricated.

Picking up the prepositioned semiconductor chips 1 is done so that the upper tool 20 is prepositioned above the semiconductor chips 1 to be picked up without a vacuum p1 being applied to the bottom side 23b of the plunger 23 so that each plunger 23 is positioned above one of the semiconductor chips 1. For this, the plungers 23, each relative to the other, are arranged corresponding to the predefined positioning of the semiconductor chips 1 on the substrate 2.

By creating a vacuum p1 at the bottom sides 23b of the plungers 23 the semiconductor chips 1 are picked up into position as explained above and maintained so that they are positioned as predefined in relation to the upper tool 20 and the plungers 23. The upper tool 20 with the picked-up semiconductor chips 1 can then be positioned above the lower tool 10 and plunged in the direction of the latter so that the semiconductor chips 1 can be precisely placed on the substrate 2 or bonding material 3 already applied to the substrate 2 each prepositioned as defined. Should, as explained above, the semiconductor chips 1 be prepositioned in making use of a feeder film, the picked-up semiconductor chips 1 are stripped from the feeder film by the travel of the upper tool 20 from the preposition towards the lower tool 10.

Once the semiconductor chips 1 have been placed on the substrate 2 the upper tool 20 is pressed by using a force F in the direction of the lower tool 10 so that the plungers 23 exert a contact pressure on the semiconductor chips 1 and on the substrate 2 inserted in the lower tool 10. The pressure pad 22 provides an homogenous distribution of the contact pressure on the semiconductor chips 1. The contact pressure force F and the elastomeric response of the pressure pad 22 are matched so that the semiconductor chips 1 are pressed against the substrate 2 by a predefined contact pressure.

As long as this contact pressure is effective, the bonding agent 3 as well as at least the adjoining portions of the circuitry pattern 2a and of the semiconductor chips 1 are heated for a predefined duration to a predefined temperature to produce a firm, durable and planar bond between the semiconductor chips 1 and the substrate 2. This predefined temperature is created by using a heatable mount 12 which can be heated, for example, to temperatures in the region of 150° C. to 270° C., e.g., to approx 250° C. as may be done before or during the contact pressure being effective.

An optional compensating film 30 is used to ensure the force is introduced into the patterned surface of the semiconductor chips 1 homogenously, whilst preventing the latter being damaged by the bottom sides 23b of the plungers 23 during application of the contact pressure. Compensating film 30 can be disposed in the upper tool 20 between the bottom sides 23b of the plungers 23 and the semiconductor chips 1. To permit picking up the semiconductor chips 1, despite the compensating film 30, the latter is provided with openings 31a positioned so that a vacuum p1 acting on the bottom sides 23b of the plungers 23 is also effective due to the openings 31a on the semiconductor chips 1, enabling the latter as described above to be picked up in the direction of the plungers 23 despite the compensating film 30 in the direction of the bottom side 23b, maintained in this picked up position and permitting positioning together with the upper tool 20 relative to the lower tool 10.

Compensating film 30 is subjected to wear and tear. In one embodiment, for semi- or fully automated fabrication of a plurality of identically componented substrates 2, the compensating film 30 is joined by using a transporting means joined to the upper tool 20, making it possible to remove a portion of compensating film 30, configured for example as a strip, below the bottom sides 23b of the plungers 23 along the bottom sides 23b in thus replacing a used portion of the compensating film 30 by using a new portion. The used portion is removed before damage occurs to the semiconductor chips 1 because the compensating film 30 has become worn out. Using a new portion may occur, for example, every time when a predefined number of substrates 2 was componented with the portion in question. The new portion of the compensating film 30 will then be positioned with its prefabricated openings 31a below the bottom sides 23b of the plungers 23.

Figure 2B:
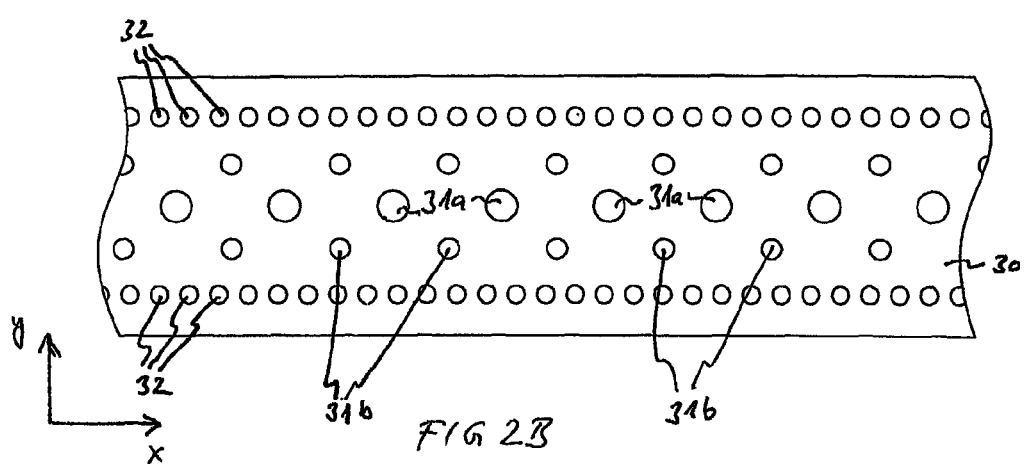
FIG. 2B is a top-down view of a compensating film positionable at the bottom side of the plunger between the plunger and a semiconductor chip to be bonded in an assembly as illustrated in FIG. 2A.

The transporter may be configured for example as a tractor including protuberances engaging a tractor perforation 32 in the compensating film 30 as illustrated in FIG. 2B, whereby the tractor may operate push/pull powered by a stepper motor.

FIG. 2B illustrates how the compensating film 30 may feature in addition to the tractor perforation 32 also openings 31a as already illustrated in FIG. 2A for picking up the semiconductor chips 1 by vacuum application. Like the tractor perforation 32, openings 31a may be produced, for example, by being punched. To be able to make use of such a compensating film 30 for a variety of substrates 2 to be componented, the film 30 may optionally include additional openings 31b not needed for present componenting as long as these openings 31b are not detrimental to the protective function of the compensating film 30 in any of the various substrates 2 to be componented.

Figure 3:
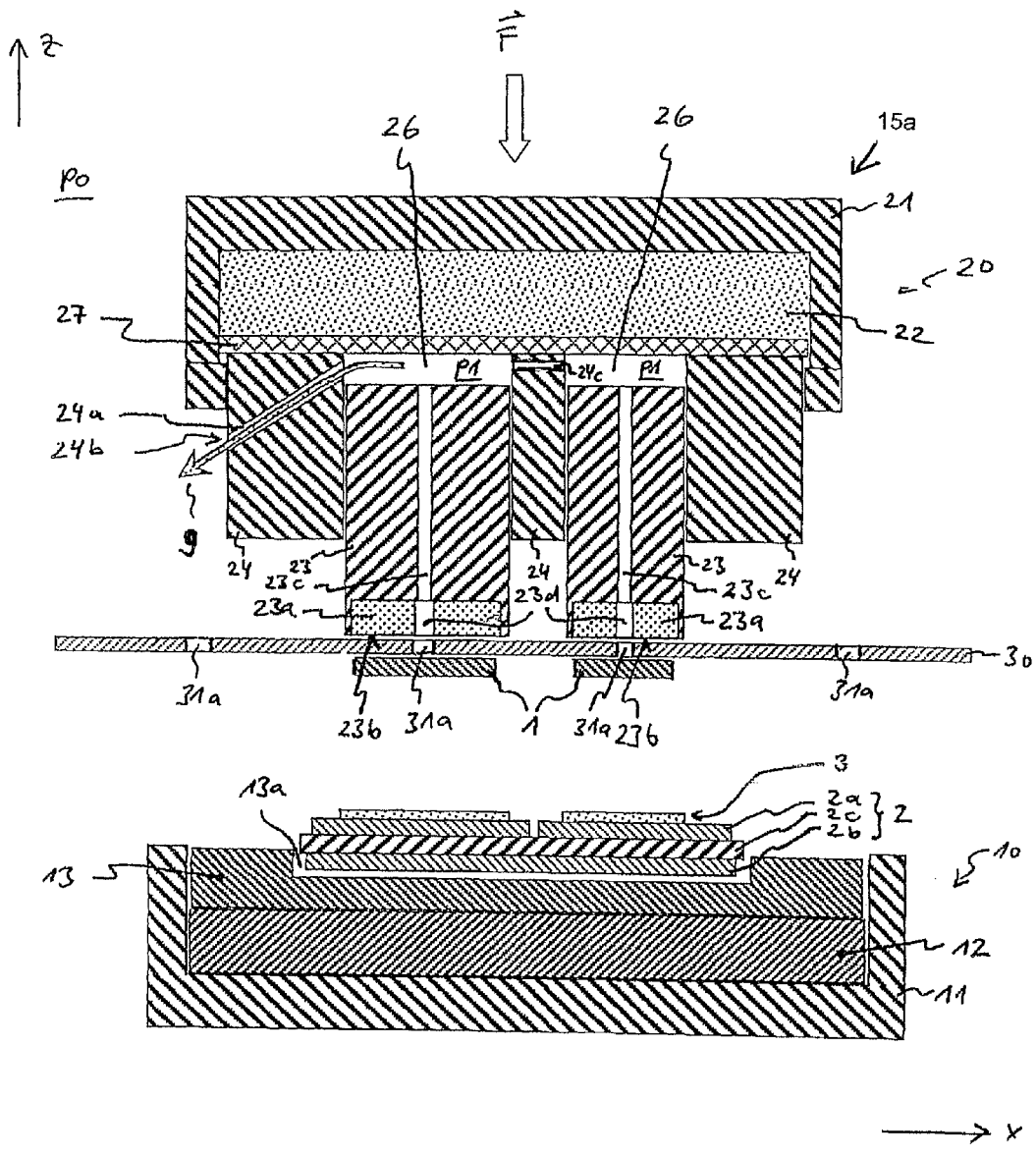
FIG. 3 is a cross-sectional view of an assembly as illustrated in FIG. 2A with the difference that the pressure transmission element is ported full-length, a compensating film arranged at the bottom side of the plunger being positioned in relation to the plunger so that a port provided by the compensating film is in line with the port of the pressure transmission element.

FIG. 3 illustrates a device 15a that differs from the device 15 as described with reference to FIG. 2A simply by the pressure transmission elements 23a including openings 23d pneumatically coupled to the corresponding vacuum conduits 23c and which, for example, may be arranged below the bottom end of the corresponding vacuum conduit 23c. The pressure transmission elements 23a may be made of the same materials and structured the same as the pressure transmission elements 23a as explained earlier by way of the device as illustrated in FIG. 2A.

In one embodiment, the pressure transmission elements 23a may also be made of a non-porous, solid material, for example of metal. The domain taken up by the pressure transmission element 23a in the device 15a as illustrated in FIG. 3 is replaced by the material of the plungers 23 so that the vacuum conduits 23c port into the bottom side 23b of the corresponding plunger 23. Picking up, positioning and bonding the semiconductor chips 1 can be done in the same way as described with reference to FIG. 2A. The difference in the configuration of the pressure transmission elements and of the plungers merely results in a difference in the distribution of the vacuum p1 acting on the bottom sides 23b of the plungers 23. The compensating film 30 may be likewise configured the same as for the compensating film 30 as described with reference to FIG. 2B.

Figure 4A:
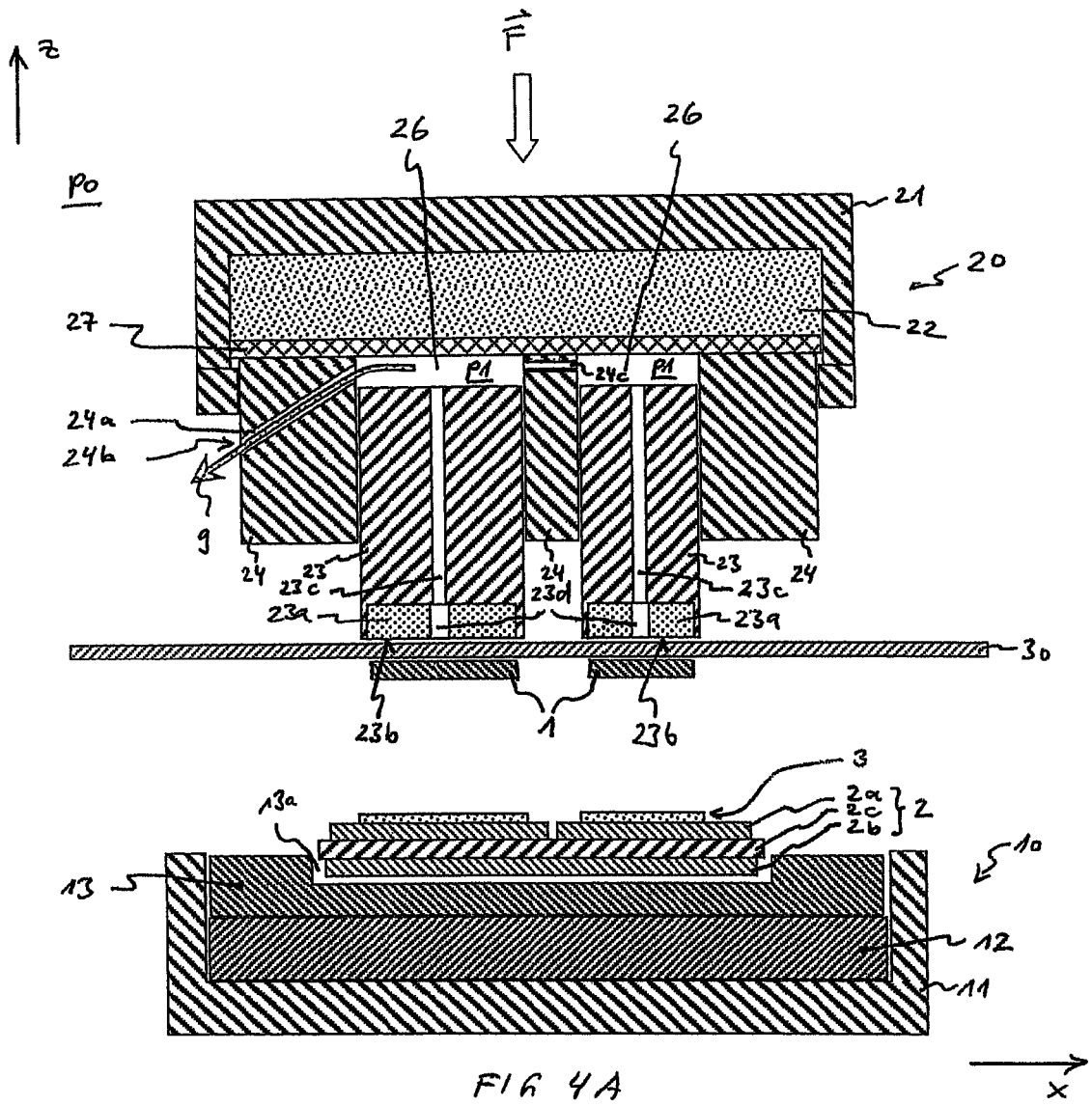
FIG. 4A is a cross-sectional view of an assembly as illustrated in FIG. 3 in which a compensating film is positioned at the bottom side of the plunger so that the compensating film closes off the port provided in the pressure transmission element.
Figure 4B:
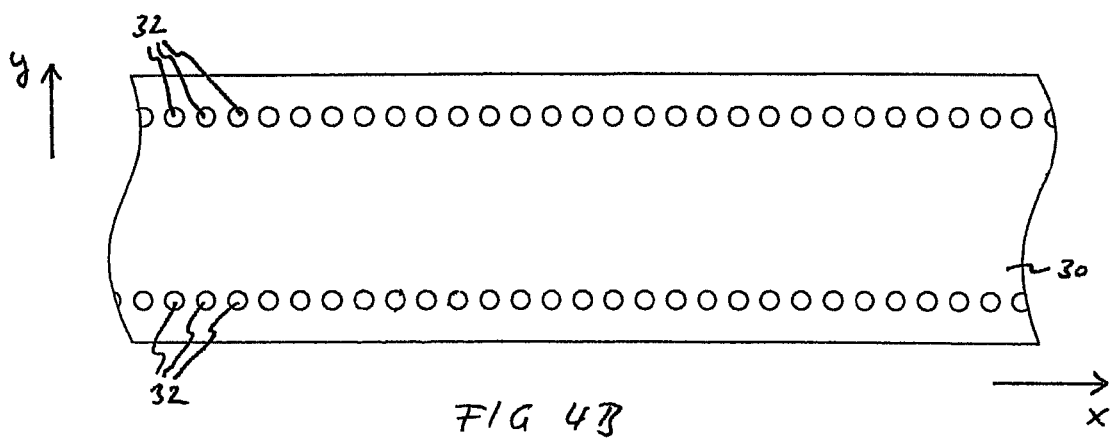
FIG. 4B is a top-down view of a compensating film as employed in the assembly as illustrated in FIG. 4A.
Figure 4G:
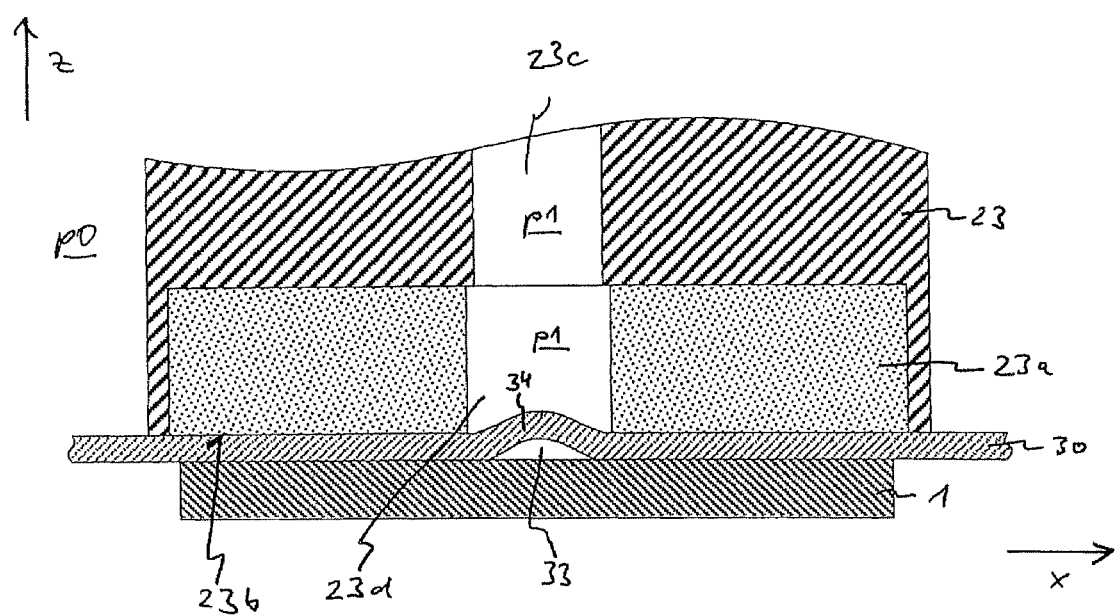
FIG. 4C is a magnified view of a portion of the assembly as illustrated in FIG. 4A in the region of the bottom side of one of the plungers, the compensating film being picked up by the vacuum in the region of the port of the pressure transmission element so that a dimple materializes in the side of the film facing away from the pressure transmission element at which likewise a vacuum is created by using which the semiconductor chip is held at the bottom side of the plunger.

FIG. 4A illustrates how, using the device 15a (10, 20) as explained with reference to FIG. 3, picking up the semiconductor chips 1 by vacuum application may also be done in accordance with another principle with one difference that this method makes use of a modified compensating film 30 as illustrated in FIG. 4B. In one embodiment, compensating film 30 includes just one tractor perforation 32 but no openings 31a as provided for in the compensating film 30 as illustrated in FIG. 2B. This results in pick-up of the compensating film 30 by vacuum p1 to the bottom sides 23b of the plungers 23 causing a portion 34 of the compensating film 30 to be sucked into the opening 23d of the pressure transmission element 23a, producing a dimple 33 in the side of the compensating film 30 facing away from the plunger 23 which in turn creates a vacuum by using which a semiconductor chip 1 can be picked up in the direction of the bottom side 23b of the plunger 23 and thus to the upper tool 20. In this method of vacuum pick-up in which the openings 23d of the pressure transmission elements 23a are closed off by the compensating film 30 it may also be achieved by using a compensating film configured the same as the compensating film 30 as illustrated in FIG. 2B but not including the openings 31a.

FIG. 4C illustrates one embodiment of a portion of the bottom end of a plunger 23 in a magnified view in which a portion of the compensating film 30 in forming a dimple 33 is sucked into an opening 23d of a pressure transmission element 23a. As an alternative to this the vacuum conduit 23c can extend to the bottom side 23b of the plunger 23 when a plunger 23 is not provided with a separate pressure transmission element 23a in which case the portion 34 of the compensating film 30 would be sucked into the port of the vacuum conduit 23c at the bottom side 23b.

In one or more embodiments, to employ the device 10, 20 as explained above, for a variety of substrates 2 to be componented and for various semiconductor chips 1 the pressure transmission elements 23a may be configured as inserts in the plungers 23. The device can be configured or adapted to the assembly to be fabricated in each case simply by changing the pressure transmission elements 23a. When a plunger 23 includes a plurality of vacuum conduits 23c pneumatically interconnected and each—when the pressure transmission element 23a is removed—porting to the bottom side of the plunger 23, a variety of pressure transmission elements 23a can be employed. In one embodiment, each pressure transmission element 23a includes one or more openings 23d arranged below one of the ports in the inserted condition of the pressure transmission element 23a. When the pressure transmission element 23a—except for the openings 23d—is made of a non-gas permeable material, the ports not in use as explained above are closed off by the pressure transmission element 23a.

Although the invention has been described hitherto by way of example embodiments in which the first bonding partner 1 is a semiconductor chip and the second bonding partner 2 is a substrate, it is understood that any other partners can also be correspondingly firmly and durably bonded to each other. Thus, for instance, the first bonding partner 1 may also be a metal platelet 7 (see FIGS. 1B, 1C and 1D), a substrate 2 (see FIGS. 1A to 1D, 2A, 3A and 4A) or a base plate 5 (see FIGS. 1C and 1D) of a power semiconductor module. Irrespective of what kind of first bonding partner 1 is involved, the second bonding partner 2 may not only involve a substrate 2 but another embodiment also a semiconductor chip 1 (see FIGS. 1A to 1D, 2A, 3A and 4A), a metal platelet 7 (see FIGS. 1B, 1C and 1D) or a base plate 5 (see FIGS. 1C and 1D) of a power semiconductor module.

Figure 5A:
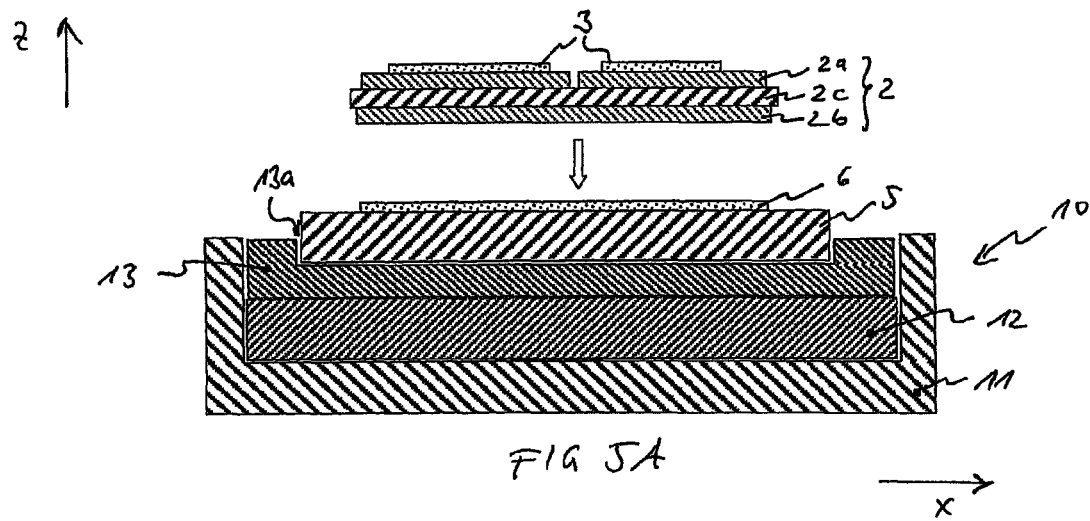
FIGS. 5A to 5C illustrate various processes in fabricating a sub-module for a power semiconductor module illustrated in cross-section in FIG. 1B.
Figure 5B:
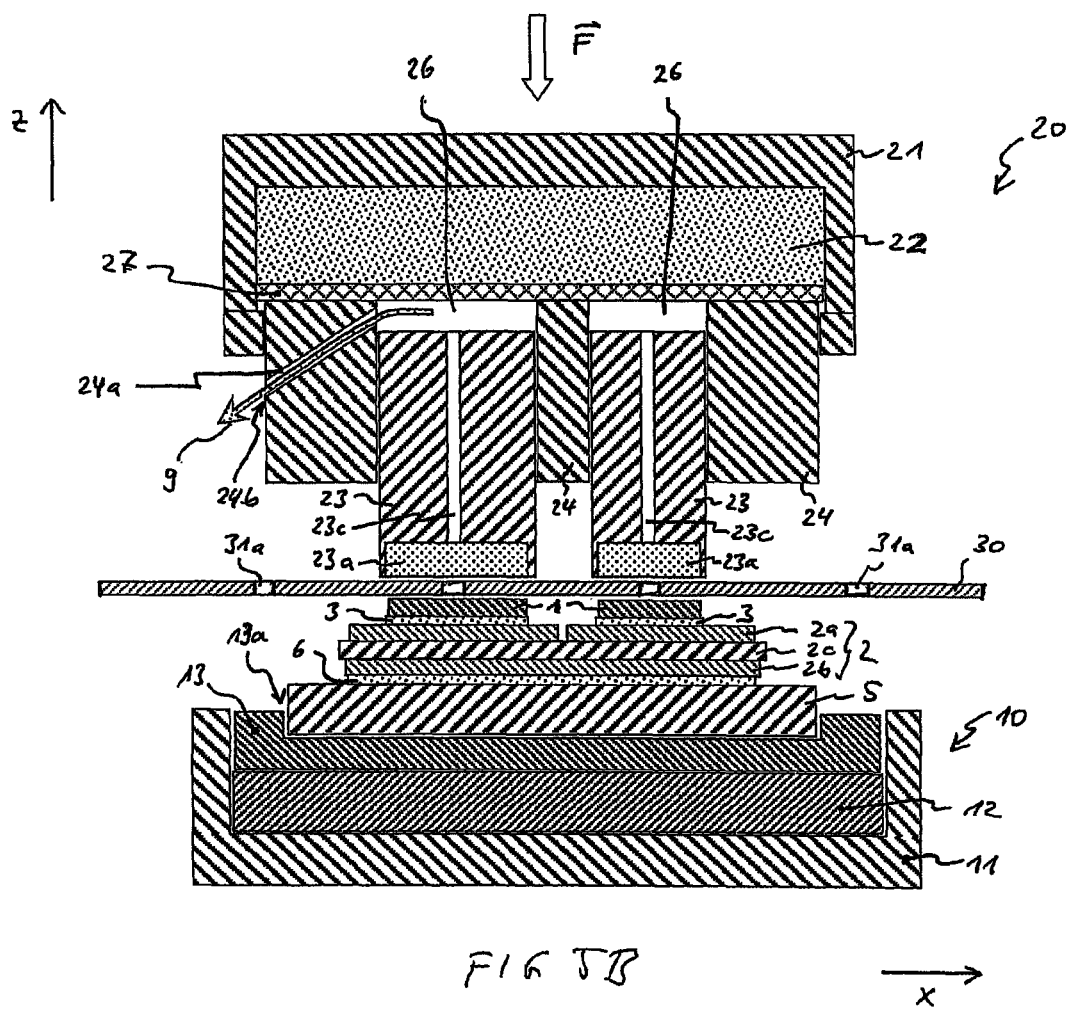
Figure 5G:
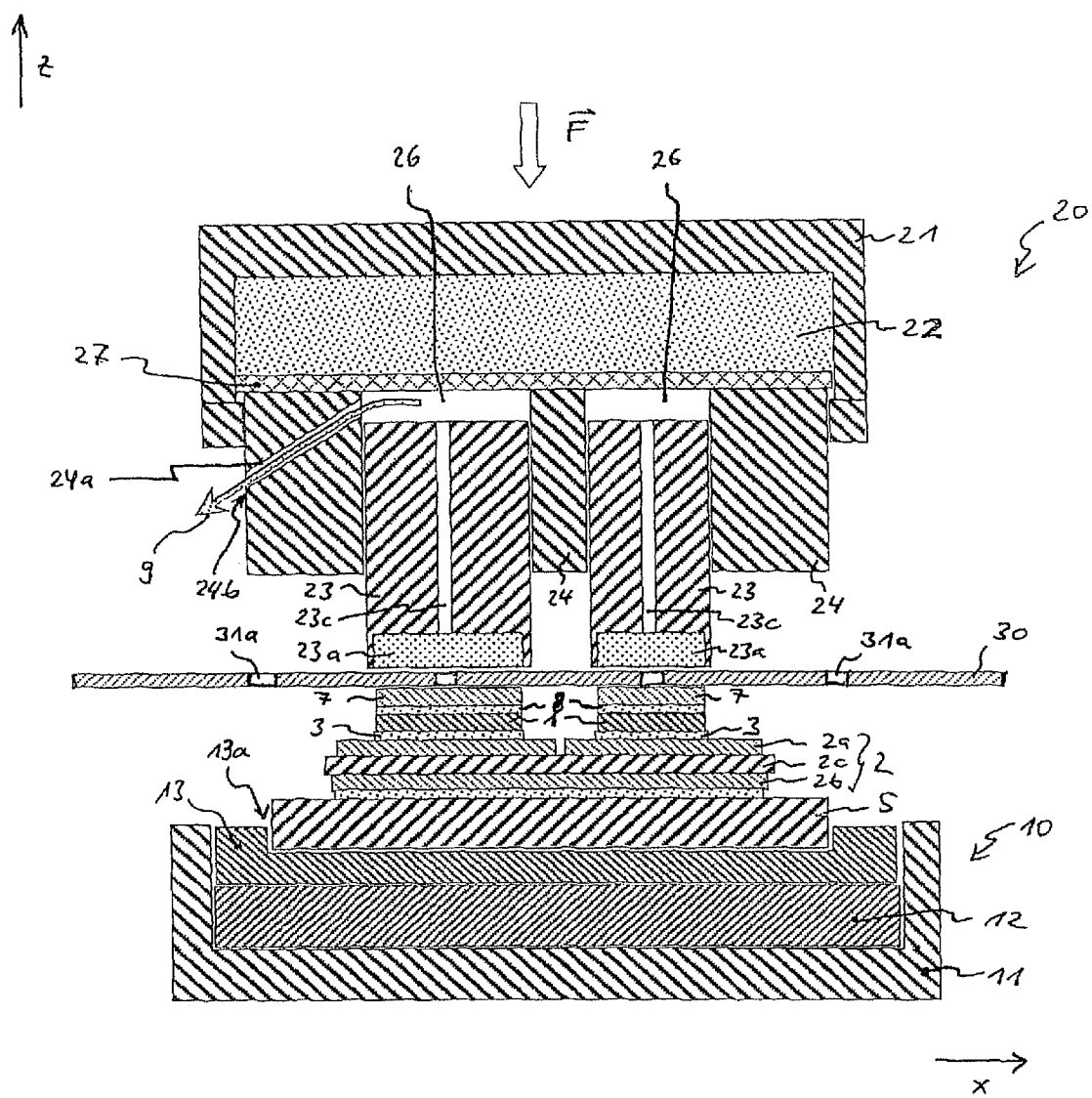

FIGS. 5A to 5C illustrate one embodiment, as an example of the above, including a method for fabricating an assembly for a power semiconductor module configured the same as the assembly illustrated cross-sectionally in FIG. 1B. In FIG. 5A a base plate 5 is inserted into a recess 13a of a positioning aid 13. The recess 13a is adapted to the base plate 5. The base plate 5 can be, for example, in accordance with one embodiment of a method as explained above with reference to the semiconductor chips 1, picked up by the vacuum of an upper tool 20 (not illustrated) and inserted into the recess 13a. The base plate 5 may also be picked up by the vacuum of a plurality of plungers 23 in common A bonding agent 6 is applied to the top-side of the base plate 5 before being inserted into the recess 13a, i.e. outside of the lower tool 10, after which the base plate 5 now provided with the bonding agent 6 is inserted into the recess 13a. Insertion can be done by it being picked up by the vacuum of the upper tool 20 or by using any other suitable feeder device, or even manually.

In a further process a bonding agent 3 is placed outside of the lower tool 10 on portions of the top-side circuitry pattern 2a of a prefabricated substrate 2, i.e. an insulating substrate 2c featuring a top-side circuitry pattern 2a and an optional bottom side metallization 2b. The prefabricated substrate 2 now provided with the bonding agent 3 is picked up by the vacuum of the upper tool 20 and placed on the base plate 5 provided with the bonding agent 6. However, instead of the upper tool 20 placement may also be done by using any other suitable feeder device.

Because of the weight of the substrate 2 being high as compared to that of the semiconductor chips 1to be componented there is very little risk of the substrate 2 slipping out of place. Referring now to FIG. 5B there is illustrated how in the process illustrated therein the semiconductor chips 1 can be placed as positioned predefined on the substrate 2 without the bonding agent 6 disposed between the base plate 5 and the substrate 2 needing to be converted into a firm bonding layer by application of pressure and/or temperature.

After placement of the semiconductor chips 1 the upper tool 20 is pressed in the direction of the lower tool 10 so that the plungers 23 exert a contact pressure on the semiconductor chip 1 in the direction of the base plate 5 and the substrate 2. Before or during application of the contact pressure the heatable mount 12 is heated, as explained above, resulting in the bonding agent 3 and at least the adjoining portions of the circuitry pattern 2a and of the semiconductor chips 1 as well as the bonding agent 6 and at least adjoining portions of the metallization 2b and of the base plate 5 each being heated to a predefined temperature, e.g., in the range 150° C. to 270° C. to convert the bonding agents 3, 6 with simultaneously application of the force F into firm, durable, high-temperature bonding layers. Depending on the nature of the bonding agent 3, 6 used and the nature of the bonding partners 1, 2a or 5, 2b bonded thereby the melting point of the bonding layers, when completed, may be higher than that of the bonding agents 3 or 6 originally.

Due to the bonds thus produced the semiconductor chips 1 are now firmly bonded to the substrate 2 and to the base plate 5 and thus safe from slipping out of place. After topping the semiconductor chips 1 with a further bonding agent 8 the metal platelets 7 can be picked up in the same way as explained above for the semiconductor chips 1 by the vacuum of the upper tool 20 and the plungers 23 and placed on the top-side of the semiconductor chips 1 and press contacted by the plungers 23 with the semiconductor chips 1, the substrate 2 and the base plate 5 by plunging the upper tool 20 in the direction of the lower tool 10. In a further temperature control step the bonding agent 8 and at least the adjoining portions of the semiconductor chips 1 and of the metal platelets 7 can be heated each to a predefined temperature, e.g., in the range 150° C. to 270° C. to convert the bonding agent 8 with simultaneously application of the force F into a firm, durable, high temperature bonding layer The completed sub-module can then be picked up by the vacuum of the upper tool 20 from the lower tool 10 and, for example, deposited in a magazine.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making a semiconductor device including bonding two first bonding partners to a second bonding partner, comprising:
   providing a device comprising a lower tool and an upper tool, the upper tool comprising two plungers each having a bottom side facing the lower tool at which bottom side a vacuum is creatable;
   providing, for each of the plungers, a pressure transmission element configured as a porous body which is arranged on that side of the respective plunger facing the lower tool;
   positioning the second bonding partner in the lower tool;
   picking up each of the first bonding partners at the bottom side of another one of the plungers by creating a vacuum at the bottom side of the respective plunger, including positioning the first bonding partners above predefined bonding sites on the second bonding partner; and
   pressing the first bonding partners against the second bonding partner by using the plungers with a predefined contact pressure of at least 900 N/cm$^2$,
   wherein before picking up the first bonding partners by vacuum, disposing a portion of a compensation film between the plungers and the first bonding partners.

2. The method as set forth in claim 1 wherein prior to pressing the first bonding partners against the second bonding partner, further comprising:
   applying a bonding agent configured as a paste comprising a powdered metal and at least one solvent, to the first bonding partners or second bonding partner.

3. A method for bonding two first bonding partners to a second bonding partner, comprising:
   providing a device comprising a lower tool and an upper tool, the upper tool comprising two plungers each having a bottom side facing the lower tool at which bottom side, relative to the pressure of the ambient atmosphere of the device, a vacuum is creatable;

providing, for each of the plungers, a pressure transmission element configured as a porous body which is arranged on that side of the respective plunger facing the lower tool;

positioning the second bonding partner in the lower tool;

positioning the plungers and the first bonding partners, each relative to the other, so that each of the first bonding partners is located below the bottom side of the respective plunger;

picking up each of the first bonding partners at the bottom side of another one of the plungers by creating, relative to the pressure of the ambient atmosphere of the device, a vacuum at the bottom side of the respective plunger facing the lower tool;

positioning the picked-up first bonding partners above predefined bonding sites on the second bonding partner; and pressing the first bonding partners against the second bonding partner by using the plungers with a predefined contact pressure of at least 900 N/cm$^2$, wherein before picking up the first bonding partners by vacuum, disposing a portion of a compensation film between the plungers and the first bonding partners.

4. The method as set forth in claim 3 wherein prior to pressing the first bonding partners against the second bonding partner a bonding agent configured as a paste comprising a powdered metal and at least one solvent is applied to the first bonding partners and/or second bonding partner.

5. The method as set forth in claim 4 wherein the powdered metal is a silver or silver alloy powder.

6. The method as set forth in claim 3 wherein the bonding layer and at least portions of the first bonding partners and of the second bonding partner adjoining the bonding layer are heated to a predefined temperature in the range 150° C. to 270° C.

7. The method as set forth in claim 6 wherein the predefined temperature and predefined contact pressure act simultaneously on the first bonding partners and on the second bonding partner for a predefined duration.

8. The method as set forth in claim 3 wherein the portion of the compensating film comprises at least one opening positioned below the bottom side of each plunger so that a vacuum created at the bottom side of each plunger makes it possible through the at least one opening to vacuum pick-up the first bonding partners arranged at the side of the compensating film facing away from the plungers.

9. The method as set forth in claim 8 wherein each plunger comprises an integrated conduit extending down to the bottom side of each plunger under which the at least one opening is arranged.

10. The method as set forth in claim 3 wherein the pressure transmission element is configured as a sintered metal body or as a sintered ceramic body.

11. The method as set forth in claim 3 wherein each first bonding partner is a semiconductor chip or a metal platelet or a conductor board or a base plate of a power semiconductor module.

12. The method as set forth in claim 3 wherein the second bonding partner is a semiconductor chip or a metal platelet or a conductor board or a base plate of a power semiconductor module.

13. A method for making a semiconductor device including bonding two first bonding partners to a second bonding partner comprising:

providing a device comprising a lower tool and an upper tool, the upper tool comprising two plungers each having a bottom side facing the lower tool at which bottom side, relative to the pressure of the ambient atmosphere of the device, a vacuum is creatable;

providing, for each of the plungers, a pressure transmission element configured as a porous body which is arranged on that side of the respective plunger facing the lower tool;

an elastic pressure pad being arranged at the side of each plunger facing away from the lower tool;

providing the first bonding partners and the second bonding partner;

positioning the second bonding partner in the lower tool;

positioning the plungers and the first bonding partners, each relative to the other, so that each of the first bonding partners is located below the bottom side of the respective plunger;

picking up each of the first bonding partners at the bottom side of another one of the plungers by creating, relative to the pressure of the ambient atmosphere of the device, a vacuum at the bottom side of the respective plunger, the bottom side facing the lower tool;

positioning the picked-up first bonding partners above predefined bonding sites on the second bonding partner; and pressing the first bonding partners against the second bonding partner by using the plungers with a predefined contact pressure of 900 N/cm$^2$, wherein before picking up the first bonding partners by vacuum, disposing a portion of a compensation film between the plungers and the first bonding partners.

* * * * *